INVENTOR
Wilfred Percy Robins
BY
ATTORNEY

ELECTRIC OSCILLATION GENERATOR SYSTEMS

Filed July 27, 1955 2 Sheets-Sheet 2

INVENTOR
WILFRED PERCY ROBINS
BY
[signature]
ATTORNEY 2,823,313
United States Patent Office
Patented Feb. 11, 1958

2,823,313

ELECTRIC OSCILLATION GENERATOR SYSTEMS

Wilfred Percy Robins, Greenford, England, assignor to The General Electric Company Limited, London, England Application July 27, 1955, Serial No. 524,724

Claims priority, application Great Britain July 28, 1954

3 Claims. (Cl. 250—36)

Figure 1:
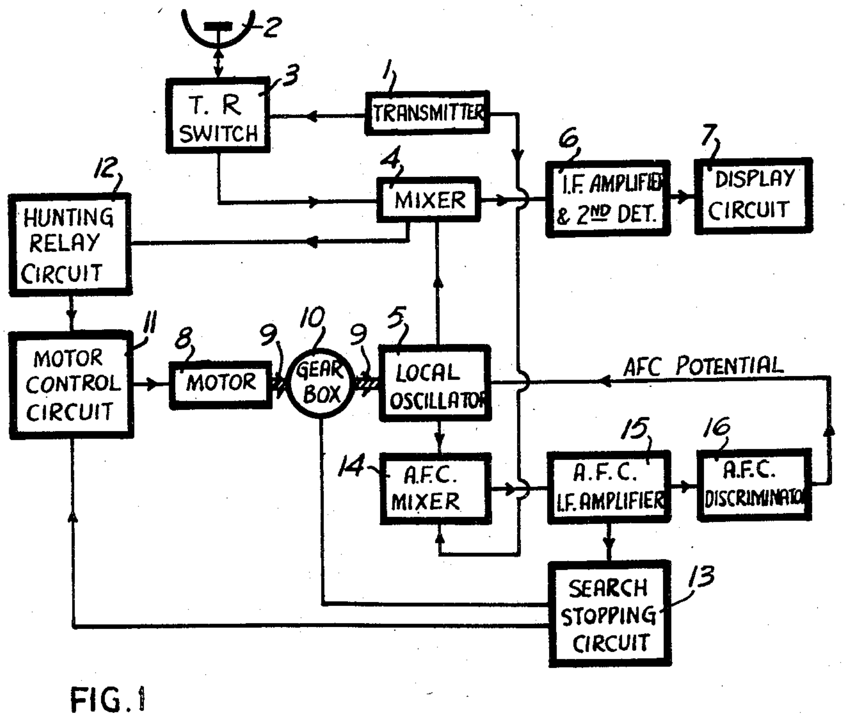

The present invention relates to electric oscillation generator systems of the kind including an electronic oscillator the frequency of which may be varied by means of both a mechanical and an electrical control, and an automatic frequency control system (the abbreviation A. F. C. system will be used henceforward in this specification) for maintaining the frequency of the oscillator as nearly as possible at a required constant difference to one side of the frequency of an input oscillation applied to the system by varying the mechanical and electrical controls. The oscillation generator system may form part, for example, of a superheterodyne type radio receiver, the oscillator being the local oscillator and the required constant difference of frequency between the oscillator and the input oscillation, in this case the received signals, being the intermediate frequency of the receiver.

Electronic oscillation generator systems of the kind specified are known, which include an electronic oscillator, such as one including a reflex velocity modulated electron tube, in which for a given setting of the mechanical frequency control, variation of the electrical frequency control (i. e. the reflector potential in the example quoted) causes the oscillator to traverse one or more modes of oscillation, in each of which, as the frequency is varied, the power of the oscillations generated varies smoothly from zero through a maximum back to zero again. Thus in the case of a typical reflex velocity modulated electron tube, variation of the reflector potential by about 60 volts causes variation of the frequency by about 30 mc./s. as the oscillator traverses a mode.

Usually one mode only is selected for operation, and again in a typical reflex velocity modulated electron tube, the centre frequency of the mode may be varied over a frequency band of approximately 1000 mc./s. by variation of the mechanical frequency control provided by movement of the tuning plungers of the resonant cavity.

To control the frequency of such an oscillator in one known system, the A. F. C. system includes a conventional electronic A. F. C. circuit to which the input oscillation and an output from the oscillator are applied, and which derives a potential varying (roughly linearly) with the difference of the frequencies of the two applied oscillations, through a datum value, usually zero, when the difference is equal to the required constant difference. This potential is applied with a preset potential to the reflector of the oscillator in such a sense that if the difference of the frequencies of the applied oscillations is too large, the oscillator frequency is altered by a variation of potential to reduce the difference and vice versa. The electronic A. F. C. circuit can only operate at the most over a band of frequencies equal to the width of the oscillator mode, i. e. about 30 mc./s.

To enable the generator system to operate over a much broader band, a motor is provided which can drive the mechanical frequency control of the oscillator to vary the centre frequency of the selected mode backwards and forwards across the required broader band. This is called a search operation, which is set up automatically when the generator system is switched on. As soon as the centre frequency of the selected mode comes near enough to the frequency at the constant difference to one side of the frequency of the input oscillation, for the electronic A. F. C. circuit to be able to operate, a search stopping circuit operates to stop the motor, the oscillator frequency then being varied only under the control of the electronic A. F. C. system. This continues until such time as, for some reason, the frequency of either the input oscillation or the output from the oscillator alters sufficiently to cause the frequency at the constant difference to one side of that of the input oscillation to fall outside the band over which the electronic A. F. C. circuit can control the frequency of the oscillator. The search stopping circuit then releases and the motor resumes its search operation again, until the condition for operation of the search stopping circuit is again achieved.

As an additional feature, the system can include provision for a motor hunting operation. If this provision is made, a hunting operation is initiated whenever the oscillator is operating under the control of the electronic A. F. C. circuit. A hunting relay circuit is provided which is actuated on each occasion that the power output of the oscillator falls by a predetermined amount below its maximum value for the setting of the mechanical frequency control. In normal operation, this will occur when the electronic A. F. C. circuit has caused the oscillator tube to operate at a point down one side of its selected mode. When actuated the hunting relay circuit sets the motor into operation in the reverse direction to that in which it was operating prior to the actuation. When the hunting operation is in progress this results in the motor hunting backwards and forwards between the limits set by the condition that the power output of the oscillator must not fall from its maximum value by more than a predetermined amount. Whilst the motor is hunting the change in frequency, which would otherwise be caused by the movement of the mechanical tuning control, is counteracted continuously by the electronic A. F. C. circuit.

When this feature is included the search stopping circuit instead of breaking the power supply to the motor, switches control of the motor to contacts controlled by the hunting relay circuit. These are arranged so that if, when the hunting operation is set up, the hunting relay circuit has not already been actuated, the motor is energised to operate in the same direction as before, until the hunting relay circuit is actuated and the motor is reversed. If, as is more usual, the motor overshoot etc. takes the motor beyond the point at which the hunting relay circuit is actuated, the motor is reversed at once. This additional feature, namely the provision of hunting, is particularly useful in counteracting the effects of slow frequency drifts caused for example by temperature changes of the oscillator tube. The frequency drift is counteracted without interrupting the operation of the generator system at the correct frequency, as would occur, if no hunting operation were possible, and the drift was allowed to continue until the search stopping circuit released and a search operation set up to restore operation at the correct frequency.

It is an object of the present invention to provide an electric oscillation generator system of the kind specified which constitutes an improvement on the known system described above, and is particularly suitable for use as the local oscillator of the receiver in a pulsed radar system, the operational frequency of which may lie at any point in a broad band of frequencies.

According to the present invention in an electric oscillation generator system of the kind specified, which includes an electronic oscillator having one or more modes of oscillation in each of which for a given setting of the mechanical frequency control, variation of the electrical frequency control causes the power output to rise from a relatively low value, which may be zero, pass through a maximum and fall to said low value again as the frequency varies, an electronic A. F. C circuit for controlling the frequency of the electronic oscillator within relatively narrow frequency limits by variation of the electrical frequency control (the frequency limits being not greater than those set by the width of the selected mode of the electronic oscillator), a search operation system which operates, when the frequency at the required constant difference to one side of that of the input oscillation does not fall within said narrow limits, by driving the mechanical frequency control of the electronic oscillator so that the centre frequency of its selected mode of oscillation sweeps continuously over the whole band of frequencies in which the system is required to operate, a search stopping circuit which is actuated to stop the operation of the search operation system as long as the said frequency at the required constant difference to one side of that of the input oscillation does fall within said relatively narrow limits, and a hunting operation system, which operates, whilst the search stopping circuit is actuated, and causes the mechanical frequency control to be varied backwards and forwards between the limits at which the power output from the electronic oscillator does not fall by more than a predetermined amount from its maximum value, the search operation system and the hunting operation system, when operating, drive the mechanical frequency control at different speeds each determined in accordance with the other parameters of the system to lie within the optimum range of speeds for varying the frequency of the oscillator during the respective operations.

The search operation system and the hunting operation system may both drive the mechanical frequency control of the oscillator by means of an electric motor, the same motor being employed in each case and the drive from the motor to the mechanical frequency control including a gear train the ratio of which is changed according to which system is in operation to give the required different speeds. The change of gear ratio may be effected on operation of the search stopping circuit, the ratio being that appropriate to the search operation system when the search stopping circuit is not operated and that appropriate to the hunting operation system when the search stopping circuit is operated.

Figure 2:
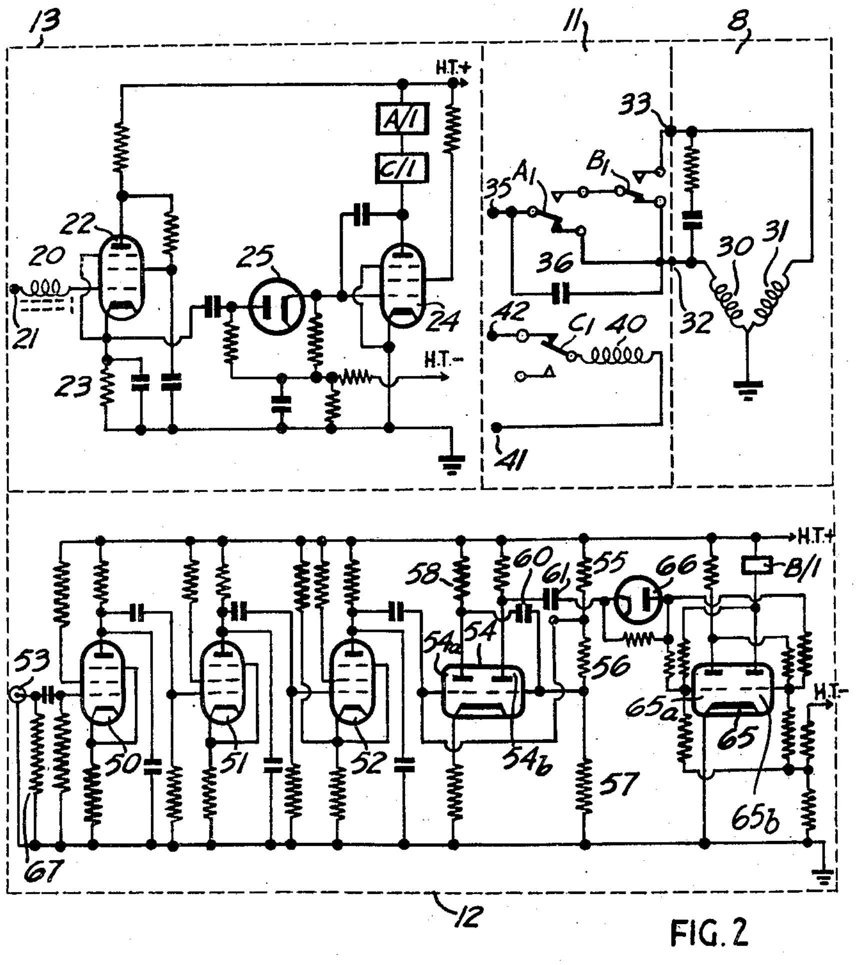

One example of an electric oscillation generator system in accordance with the present invention will now be described with reference to the accompanying drawings, in which Figure 1 shows a block circuit diagram of a pulse radar system including the system, Figure 2 shows detailed circuit diagrams of examples of a search stopping circuit, a hunting relay circuit and a motor control circuit, which may be employed in the system shown in Figure 1.

Referring now to Figure 1 of the accompanying drawings, the radar system includes a transmitter 1 which generates recurrent high power pulses of oscillations at a frequency lying in the band 8600–9700 mc./s., the precise frequency being determined by the characteristics of the magnetron oscillator valve employed. The recurrence frequency and pulse length are variable in operation over a number of predetermined combinations, but the duty cycle, i. e. the ratio of pulse recurrence period to pulse length is of the order of 1000:1 in each case. The radio frequency parts of the system are designed to handle a broad band of frequencies, so that any frequency in the band of operation may be employed without the necessity for retuning, for example after replacing the magnetron oscillator valve in the transmitter 1, except of course on the part of the local oscillator in the receiver side of the system which is retuned automatically. An output from the transmitter 1 is coupled to the antenna 2 through a transmit-receive switch 3.

Similarly the receiver mixer 4, normally a crystal mixer, is coupled to the antenna 2 through the transmit-receive switch 3, as well as to an output from the local oscillator 5. The output from the mixer 4 is fed to an I. F. amplifier and second detector 6, the I. F. amplifier being tuned to 45 mc./s. The output from the second detector 6 is fed to the video stages of the display circuit 7. The local oscillator 5 includes a reflex velocity-modulated electron tube of the kind in which the frequency is mainly determined by the size of a resonant cavity, the size being variable by means of screw-in tuning plungers. In addition variation of the reflector electrode potential, causes variation of the frequency of oscillation over a narrow range, about 30 mc./s., for any given setting of the tuning plungers. As the reflector potential is varied over a range appropriate to the selected mode of the tube, the power of the oscillations varies from zero through a maximum back to zero again.

An automatic frequency control (A. F. C.) system is provided automatically to maintain the frequency of the local oscillator 5 constantly 45 mc./s. (the intermediate frequency) below that of the transmitter 1. In alternative systems, the frequency of the local oscillator 5 may be 45 mc./s. above that of the transmitter. In addition on commencing operation or on changing the frequency of the transmitter, the A. F. C. system automatically tunes or retunes the oscillator 5 to the correct frequency. The A. F. C. system includes a reversible electric motor 8 which, through a cam drive (not shown) drives a mechanical drive 9 including a two-speed gear box 10, to screw one of the tuning plungers of the oscillator tube in and out over a range such that the oscillator 5 can be tuned to any frequency within the required band. The motor 8 is controlled by the motor control circuit 11, which itself is controlled by the hunting relay circuit 12 and the search stopping circuit 13, so that the motor 8 has two modes of operation, one a "searching" operation in which the frequency of the oscillator 5 is swept continuously backwards and forwards over the entire range the cam drive being shaped so that the mechanical drive 9 reverses after a set number of revolutions of the motor 8 equivalent to the required frequency band, and the other a "hunting" operation, in which the frequency of the centre of the selected mode of operation of the oscillator 5 is caused to oscillate slightly. When the local oscillator 5 is far off the correct frequency, the arrangement is such that the searching operation is set up immediately and, as will be explained, this continues until the frequency of the local oscillator 5 is near the required frequency.

An electronic A. F. C. circuit is also provided for deriving a variable potential which is applied to the reflector electrode of the oscillator tube, to vary the frequency of the oscillator 5 in such a manner that the tendency for the frequency of the output from the mixer 4 to the I. F. amplifier to change is resisted by a change of the frequency of the oscillator 5.

The electronic A. F. C. circuit includes an A. F. C. mixer 14, which is fed with a much attenuated output from the transmitter 1 and from the local oscillator 5. The output from the A. F. C. mixer 14 is passed through an A. F. C. I. F. amplifier 15, having a fairly wide pass band centred on 45 mc./s., to an A. F. C. discriminator circuit 16, which in known manner derives a D. C. potential varying approximately linearly through zero as the frequency of the input varies over a range of approximately 6 mc./s. about the centre frequency 45 mc./s. This potential is superimposed on the steady potential applied to the reflector electrode of the tube in the local oscillator 5.

In addition the search stopping circuit 13 is coupled, as described in the specification of U. S. patent application No. 430,646, now Patent No. 2,783,383, issued February 26, 1957, to a stage in the A. F. C. I. F. amplifier 15. This circuit includes two relays which operate simultaneously when signals of sufficient strength and duration are received, i. e. when the frequency of the local oscillator 5 reaches the pull-in frequency of the electronic A. F. C. circuit, that being the frequency at which the electronic A. F. C. can begin to operate, and from which the oscillator frequency is consequently rapidly pulled in to the correct one by the action of the electronic A. F. C. circuit. Operation of one relay of the circuit 13 causes a contact to open in the motor control circuit 11, breaking a direct power supply to the motor 8 and connecting it to a two-position contact controlled by the hunting relay circuit 12, which contact is arranged to energise the motor to rotate in opposite directions depending on the position of the contact. Operation of the other relay of the circuit 13 causes a solenoid in the motor control circuit 11 to become unenergised, causing the gear change mechanism of the gear box 10 to be operated, and thus changing the gear ratio from that appropriate to the searching operation to that appropriate to the hunting operation. After operation of the relays in the search stopping circuit 13, the frequency of the oscillator 5 is controlled by the electronic A. F. C. circuit and the hunting operation system.

In the mixer 4, the direct current component of crystal current is proportional to the power of the oscillations applied from the local oscillator 5 since the received signals are pulsed. If therefore the tube in the local oscillator 5, by virtue of variations in the A. F. C. potential applied to its reflector from the A. F. C. discriminator 16, is caused to operate towards one end of the selected mode of oscillation, so that its power output decreases, the D. C. component of crystal current in the mixer 4 will decrease accordingly. In order to prevent this operation towards one end of the selected mode, the hunting operation system is provided which, by means of the relay circuit 12 causes the mechanical frequency control of the oscillator 5 to oscillate continuously between the limits set by the condition that the D. C. component of crystal current in the mixer 4 must not decrease by more than a predetermined amount. The hunting relay circuit 12 is actuated when the crystal current falls by more than a predetermined amount, and on each actuation the motor control circuit 11 causes the motor 8 to reverse. Whilst the motor 8 is operating in this manner, the electronic A. F. C. circuit operates to counteract the frequency changes due to the variation of the mechanical frequency control, and maintains the frequency of the oscillator 5 at the correct value. If the transmitter 1 or the oscillator 5 should be subject to a continuous frequency drift, the provision of the hunting operation system enables this to be followed without any interruption of the operation of the oscillator 5, as would otherwise occur in a system without provision for hunting, as a new searching operation would have to be set up if the drift continued beyond the limits of operation of the electronic A. F. C. circuit.

As previously explained in the aforementioned specification, it is necessary that the circuits, through which signals are fed to the search stopping circuit 11, should have frequency characteristics such that at the hold-out frequency of the electronic circuit i. e. when the frequency of the oscillator 5 is as near as it can be to the image frequency, the strength of the signal applied to the search stopping circuit 13 is considerably below the response level of that circuit.

It is now necessary to consider the speeds at which the searching and hunting operations may be carried out. The searching operations, from all operational aspects, should be carried out at the greatest possible speed in order that the oscillation generator system is not off tune any longer than is absolutely necessary. An upper limit is however set by the various parameters of the system, otherwise it may happen that the motor 8 is rotating so fast that it is not stopped quickly enough for the frequency of the oscillator 5 to remain within the range of the electronic A. F. C. circuit. In a simple case where there is no provision for hunting operations and the search stopping circuit 13 merely stops the motor 8, the important parameters are those which determine the pull-in and the hold-in range of the electronic A. F. C. circuit, and the amount of rotation of the motor 8 which takes place before it comes to rest from the moment of actuation of the search stopping circuit 13.

Full investigation has shown that the maximum permissible speed of rotation of the motor 8, expressed as the maximum rate of variation of the frequency of the oscillator 5 is given by:

$$x_{max}=\frac{p+h-f_0}{r_1+s}\text{ mc./s. per second}\qquad(1)$$

where $p$ and $h$ are respectively the pull-in range and the hold-in range of the electronic A. F. C. circuit in mc./s., $f_0$ represents in mc./s. the amount by which the oscillator frequency is altered due to overrun of the motor 8 after switching off the electric supply to it, $s$ is the operating time of the search stopping circuit 13 in seconds and $r_1$ is the operating time of the relay controlled by the search stopping circuit 13. It will be appreciated that $f_0$ depends on the motor speed at the moment of switching off the supply, and assuming this to be $x_{max}$ we may write:

$$f_0=x_{max}/k$$

where $k$ is the reciprocal of the motor overrun revolutions expressed as a fraction of the number of revolutions per second performed by the motor at full speed. Substituting for $f_0$ in Equation (1) we obtain an alternative expression:

$$x_{max}=\frac{p+h}{r_1+s+1/k}\text{ mc./s. per second}\qquad(2)$$

This criterion changes slightly, although the principle of obtaining it is much the same, in a case such as that described with reference to Figure 1, where a hunting operation starts as soon as a searching operation ceases. In this case the mechanical frequency control will pass through the position at which the output power of the oscillator is a maximum to the point where the hunting relay circuit is actuated and the motor is reversed. The motor speed and the operating time constants must therefore be determined so that the reversal takes place within the hold-in range of the electronic A. F. C. circuit in order that the search stopping circuit shall remain operated. Additional factors to be taken into account are the time constant of the hunting relay circuit $m$ secs., the operating time of the motor control circuit $r_2$ secs., the frequency difference between the centre of the oscillator mode and the point at which the amount of change of crystal current is sufficient to actuate the hunting relay circuit, which may be represented as $i$ mc./s., the operating time of the gear change mechanism $l$ secs., and the ratio $g$ between the hunting gear ratio and the searching gear ratio. Equation 2 then becomes:

$$x_{max}=\frac{p+h-i}{s+r_1+l}\text{ mc./s. per second}\qquad(3)$$

if motor overrun is ignored, or:

$$x_{max}+\frac{p+h-i}{s+r_1+l+(m+r_2)/g+1/gk}\text{ mc./s. per second}\qquad(4)$$

when all factors are taken into account.

In Equation 4 there are two unknown quantities $x_{max}$ and $g$, and these must be determined to give optimum operation of the system. Since the motor overrun occurs when the gear reduction in the drive is greatest, we must use Equation 3 to obtain a rough estimate of $x_{max}$, by calculating the value given by that equation and selecting a rather lower value to allow for the approximation. The factor $g$ may then be determined by taking the ratio of this value for $x_{max}$ and the value of the optimum hunting speed determined as set out below, and the validity of the approximation can then be checked by substituting these values in Equation 4. Alternatively a process of successive approximation may be employed to obtain a more accurate value.

Similar considerations apply in obtaining the maximum hunting speed. Assuming the motor has time to reach its full speed between successive reversals, the maximum hunting speed is determined by the fact that once a reversal has been initiated, it must be completed before the mechanical frequency control has driven the oscillator beyond the hold-in range of the electronic A. F. C. circuit. Consideration of the factors involved gives rise to the following expression for the maximum hunting speed:

$$y_{max}=\frac{h-i'}{m+r_2+1/k} \text{ mc./s. per second} \qquad (5)$$

where $i'$ represents the frequency difference between the centre of the oscillator mode and the point at which, with the motor operating at full hunting speed, the amount of fall in crystal current is sufficient to cause the hunting relay circuit to be actuated, and the other factors are as defined previously.

This expression has to be corrected if the residual error of the electronic A. F. C. circuit is not to become unacceptably high at the edges of the mode, where owing to the low oscillator output power loop gain of the electronic A. F. C. circuit will be reduced considerably. It is therefore desirable in practice to limit the operation to the range between the points at which the power output of the oscillator is, say, half of the maximum power output. This limitation may be incorporated in Equation 5 approximately by rewriting that equation as:

$$y_{max}=\frac{h/_2-i'}{m+r_2+1/k} \text{ mc./s. per second} \qquad (6)$$

This variation in the oscillator output power may also cause some modulation of the I. F. signal supplied by the mixer 4 and, moreover, at the edges of the hunting range there is a deterioration in the overall signal-to-noise ratio of the receiver. Accordingly there may be a further reduction in the portion of the hold-in range that is utilised.

There is however another factor, independent of the above, which must be considered when determining the maximum tuning speed used in the hunting operations, that factor being the transient response characteristics of the electronic A. F. C. circuit. In a searching operation this is not important, unless the motor speed is very high indeed, but in a hunting operation the electronic A. F. C. circuit must maintain the oscillator frequency constant within close limits, and the ability of the circuit to do this at a given motor speed will depend on its transient characteristics. It may be shown that the maximum tuning speed permissible in the light of this factor is given by:

$$z_{max}=AEf \text{ mc./s. per second} \qquad (7)$$

where A is the fraction of a tuning error initially existing at the occurrence of one input pulse that is corrected before the next input pulse, E is the maximum permissible tuning error and $f$ is the pulse recurrence frequency of the input signal. The maximum speed thus calculated must obviously be compared with that given by the factors which gave rise to Equation 6. However given a well designed electronic A. F. C. circuit $z_{max}$ will usually exceed $y_{max}$.

There is no operational requirement for the hunting operation to be carried out as quickly as possible, as there is in the case of the searching operation, since the oscillator is maintained in tune continuously. Thus any convenient speed less than the maximum may be selected, though in practice a lower limit will be set by the difficulty in designing the hunting relay circuit, if the rate of change of crystal current is very small due to a slow motor speed.

In the system described with reference to Figure 1, the majority of the blocks represent circuits which are of well known form and need not be described here in detail. Detailed diagrams of circuits for others of the blocks, namely the search stopping circuit 13, the hunting relay circuit 12 and the motor control circuit 11, are however shown in Figure 2 of the accompanying drawings.

The search stopping circuit 13 is the same as that described in detail in the aforementioned specification. It consists simply of a suitably designed input network, coupling the input terminal 21 (this is coupled by a common inductance coupling to an interstage coupling in the A. F. C. I. F. amplifier 15) to the control grid of a pentode thermionic valve 22, connected in known manner in an infinite impedance detector stage. The output from this stage is taken from across the cathode load resistor 23 and is applied through a coupling circuit to the input of a Miller integrator stage incorporating the pentode thermionic valve 24. A low impedance diode 25 is included in the input circuit of the integrator stage, so that as described in the aforementioned specification, the time constants for charge and discharge of the integrator stage are different. The factors making this difference necessary and a method of determining the time constants are described in that specification.

The anode load of the integrator stage comprises the windings of two relays A and C connected in series, these windings being energised to operate the associated contacts in the motor control circuit 11 only when a sufficiently large signal is applied to the input of the search stopping circuit for sufficient time.

The motor 8 is a two-phase A. C. motor having two windings 30 and 31 and is arranged to rotate in either direction. One end of each of the windings 30 and 31 is earthed, whilst the other ends are connected to input terminals 32 and 33 respectively, across which is connected a phasing network, providing a phase shift of approximately 90°.

In the motor control circuit 11, one side of a 50 volt 400 c./s. supply (not shown) for the motor 8 is connected to the terminal 35, the other side of the source being earthed. The terminal 35 is connected to the moving contactor of the contact A1 of the relay A, the winding of which is connected in the search stopping circuit 13. When the relay A is not energised the moving contactor makes contact with a fixed contact which is connected directly to the terminal 32, whilst the fixed contact, with which it makes contact when the relay A is energised is connected to the moving contactor of the contact B1 of a relay B, the winding of which is connected in the hunting relay circuit 12. The fixed contacts of the contact B1 are connected one to each of the terminals 32 and 33. The contacts A1 and B1 thus serve selectively to connect the supply terminal 35 to the input terminals 32 and 33 of the motor 8, the particular connection determining the direction of rotation of the motor 8. A capacitor 36 is connected across the terminals 35 and 32 in order to reduce sparking at the contacts across which it is connected.

In addition the operating winding 40 of the gear change mechanism of the gear box 10 (Figure 1) is connected across the moving contactor of the contact C1 and one terminal 41 of a pair of terminals 41 and 42, across which is connected a 24 volts D. C. operating supply (not shown). One fixed contact of the contact C1 is connected to the other terminal 42, whilst the other fixed contact, the one with which the moving contactor makes contact, when the relay C is energised, is unconnected.

It can be seen that actuation of the search stopping circuit 13 and hence energisation of the relays A and C results in the changeover of contact A1 thus connecting terminal 35 to the moving contactor of contact B1 instead of directly to terminal 32 and the changeover of contact C1 thus disconnecting the winding 40 from across the terminals 41 and 42, thereby causing the gear change mechanism to operate.

The hunting relay circuit 12 includes a low pass amplifier consisting of three stages coupled in cascade, these stages incorporating respectively the three pentode thermionic valves 50–52. The input terminal 53 to the circuit 12 is coupled to the control grid of the valve 50 in the first stage of the amplifier. The output from the amplifier is taken from the anode of the valve 52 in the final stage and is applied to a monostable trigger circuit constituted by the double triode thermionic valve 54 and the associated components. By virtue of the connection of the control grids of the constituent triodes 54*a* and 54*b* to different points on the potentiometer chain formed by the resistors 55—57, the triode 54*a* is normally conducting and the triode 54*b* non-conducting and the circuit is stable in that state. If a sufficiently large negative potential is applied to the control grid of the triode 54*a*, the circuit will however change to its unstable state with the triode 54*b* conducting and the triode 54*a* non-conducting for a time determined by the time constant of the circuit consisting of the resistors 57 and 58 and the capacitor 60, before changing back automatically to the stable state. Whenever the circuit is triggered, a negative pulse appears at the anode of the triode 54*b* having a duration equal to the time during which the circuit remains in its unstable state.

The anode of the triode 54*b* is coupled to the control grids of both the constituent triodes 65*a* and *b* of double triode thermionic valve 65, which with its associated components forms a bistable trigger circuit. The intercircuit coupling includes a small value capacitor 61, so that the long negative pulses appearing at the anode of the triode 54*b* are differentiated before being applied to the control grids of the triodes 65*a* and *b*. The diode 66 prevents the positive resultant pulses being applied to the control grids of the triodes 65*a* and *b*. As a result short negative pulses are applied to the control grids of the triodes 65*a* and *b*, each of them causing the bistable trigger circuit to change from one of its stable states to the other, the two states being those in which one of the triodes 65*a* and *b* is conducting and the other non-conducting. The winding of a relay B is connected as the anode load of the triode 65*b*, and when the triode 65*b* is conducting, the current flowing in its winding is sufficient to energise the relay B and operate the associated contact B1 in the motor control circuit 11.

The input terminal 53 of the hunting relay circuit 12 is coupled to the circuit of the mixer 4 so that the D. C. component of the current flowing in the crystal mixer is passed through the input resistor 67, which is connected across the input terminal 53 and earth. Alternatively if the A. F. C. mixer 14 is a crystal mixer, the D. C. component of the current flowing in that may be passed through the resistor 67. Since the received signals are pulsed, this current represents the output power of the local oscillator 5. The low pass amplifier produces a negative voltage at the anode of the valve 52, when the current flowing in the resistor 67 starts to fall, the magnitude of the voltage depending on the relation between the rate of fall of the current and the time constants of the interstage coupling circuits in the amplifier. When the rate of fall of current is sufficient (which, assuming no component failures, will happen when the oscillator 5 is driven towards one end of its selected mode) the negative voltage at the anode of the valve 52, which voltage is applied to the control grid of the triode 54*a*, will reduce the potential at the control grid of the triode 54*a* below that of the triode 54*b* and the monostable trigger circuit will then change to its unstable condition, in which the triode 54*b* is conducting. When this happens a negative triggering pulse is applied to the bistable trigger circuit formed by the triode 65*a* and *b* causing it to changeover as well from whichever state it happens to be in to the other. When this happens the relay B is either released or energised according to the change occurring in the state of the trigger circuit and the motor 8 therefore reverses its direction of operation owing to the changeover of the contact B1 in the motor control circuit 11. In due time the monostable trigger circuit changes back to its stable condition, and subsequently, when the oscillator 5 has been driven back to the other side of this mode, the whole process is repeated, the motor 8 being reversed again.

It will thus be seen that when the search stopping circuit 13 is actuated the relays A and C cause the gear change mechanism of the gear box 10 to operate, so that the speed of the motor 8 is reduced to that appropriate to the hunting operation and in addition passes control of the direction of rotation of the motor 8 to the relay B in the hunting relay circuit 12. This latter circuit causes the relay B to operate every time the oscillator 5 approaches one end of its selected mode so that the direction of rotation of the motor 8 is reversed. In this way at any time when the search stopping circuit 13 is actuated the motor 8 performs a continuous hunting operation so that the oscillator 5 is driven backwards and forwards across that part of the selected mode in which the power output of the oscillator is above a predetermined level. Thus if the frequency of either the transmitter 1 or the oscillator 5 is changing slowly, the hunting operation will enable the change to be followed without pulling the oscillator 5 to one end of its mode as it will always be centred about the point at which the oscillator 5 gives the maximum power output at the correct frequency.

As an example, the derivation of the value of the searching and hunting speeds in one system as described with reference to Figures 1 and 2 will now be given. The various parameters of the system, which operates in the frequency band 8600–9700 mc./s., are as follows:

| | |
|---|---|
| Width of selected mode of the oscillator 5 (a British type VX 5028 Klystron) | ±15 mc./s. on either side of centre. |
| Hold-in range of electronic A. F. C. circuit ($h$) | 13 mc./s. |
| Pull-in range of electronic A. F. C. circuit ($p$) | 8 mc./s. |
| Voltage change at input of hunting relay circuit 12 necessary to trigger it | 1 millivolt. |
| D. C. component of crystal current at mode centre | 600 microamps. |
| Effective frequency deviation from mode centre for triggering of circuit 12 ($i$) | ±1.8 mc./s. (maximum value). |
| Time constant of hunting relay circuit 12 ($m$) | 15 milliseconds. |
| Operating times of relays A and B ($r_1$ and $r_2$) | 5 milliseconds. |
| Time constant of search stopping circuit 13 ($s$) | 15 milliseconds. |
| Time constant of gear change mechanism ($l$) | 20 milliseconds. |
| Speed of motor 8 | 6000 R. P. M. |
| Fractional overrun of motor 8 (determined by experimentally) ($k$) | 20 |
| Pulse repetition frequency of radar system ($f$) | 2500 P. P. S. |
| Time constant of electronic A. F. C. circuit | 2 milliseconds. |
| Minimum pulse to pulse correction factor of electronic A. F. C. circuit (A) | 0.2. |

From Equation 3 we have an approximate value of the maximum searching speed $$x_{\max}=\frac{p+h-i}{s+r_1+l}\text{ mc./s. per second}$$

$$x_{\max}\doteq 480\text{ mc./s. per second}$$

To make ample allowance for fall in loop gain near the edge of the oscillator mode and motor overrun, let us take $x=300$ mc./s. per second.

From Equation 6 we have maximum hunting speed $$y_{\max}=\frac{h/2-i'}{m+r_2+1/k}\text{ mc./s. per second}$$

$\therefore y_{\max}$ 80 mc./s. per second.

Checking on transient characteristics of electronic A. F. C. circuits $z_{\max}=AEf=100$ mc./s. per second assuming $E=0.2$ mc./s.

Let us choose $y=15$ mc./s. per second as a convenient value, sufficiently below the maximum to reduce residual errors, but sufficient to maintain a reasonable rate of change of input to the hunting relay circuit 11.

Then if $x=300$ mc./s. and $y=15$ mc./s., we have $g=20$.

Substituting in Equation 4 we have $$y_{\max}=\frac{p+h-i}{l+s+r_1+\frac{m+r_2}{g}+\frac{1}{gk}}\doteq 440\text{ mc./s. per second}$$

This shows that the chosen value 300 mc./s is satisfactory.

The ratios in the gear box 10 are thus chosen to give tuning speeds of 300 mc./s. per second in searching operations and 15 mc./s. per second in hunting operations.

It will be appreciated that whilst the invention has been described in relation to its application to pulse radar systems, it may equally be applied to oscillation generator systems for other types of system.

I claim:

1. An electric oscillation generator system comprising an electric oscillator which has both a mechanical frequency control and a control path over which an electric signal can be supplied to effect electrical frequency control and which is of the kind having one or more modes of operation in each of which, for a given setting of the mechanical frequency control, a change through a range of values of the amplitude of the electric signal supplied over the control path causes the power output to rise from a relatively low value, pass through a maximum, and fall to a low value again as the frequency varies, an input path, an electronic automatic frequency control circuit which supplies to the said control path an electric signal having an amplitude that is within limits a measure of the divergence of the difference between the frequency of operation of the oscillator and a control oscillation supplied over the input path from a predetermined value and which operates within the said limits to control the oscillator to reduce the said frequency difference, a search operation system which is operated when the frequency on a predetermined side of the frequency of the control oscillation and separated therefrom by the said difference is outside the said limits and which causes the mechanical frequency control of the oscillator to be driven at a first speed so that the center frequency of the selected mode of oscillation is swept continuously over a range of frequencies, a search stopping circuit to stop the operation of the search operation system when the frequency on the predetermined side of the frequency of the control oscillation and separated therefrom by the said difference falls within the said limits so that the electronic automatic frequency control circuit then operates to reduce the said difference, and a hunting operation system which is operated when the search stopping circuit is actuated as aforesaid and which causes the mechanical frequency control of the oscillation to be driven backwards and forwards at a second speed, which is different from the first speed, between limits at which the power output from the oscillator does not fall by more than a predetermined amount from its maximum value.

2. An electric oscillation generator system comprising an electronic oscillator which has both a mechanical frequency control and a control path over which an electric signal can be supplied to effect electrical frequency control and which is of the kind having one or more modes of operation in each of which, for a given setting of the mechanical frequency control, a change through a range of values of the amplitude of the electric signal supplied over the control path causes the power output to rise from a relatively low value, pass through a maximum, and fall to a low value again as the frequency varies, an electric motor, a gear box which selectively has two different gear ratios and which is connected between the electric motor and the mechanical frequency control of the oscillator, a motor control circuit, an input path, an electronic automatic frequency control circuit which supplies to the said control path an electric signal having an amplitude that is within limits a measure of the divergence of the difference between the frequency of operation of the oscillator and a control oscillation supplied over the input path from a predetermined value and which operates within the said limits to control the oscillator to reduce the said frequency difference, a search operation system which is operated when the frequency on a predetermined side of the frequency of the control oscillation and separated therefrom by the said difference is outside the said limits and which selects one of the gear ratios of the gear box and operates the motor control circuit to cause the mechanical frequency control of the oscillator to be driven at a first speed so that the center frequency of the selected mode of oscillation is swept continuously over a range of frequencies, a search stopping circuit to stop the operation of the search operation system when the frequency on the predetermined side of the frequency of the control oscillation and separated therefrom by the said difference falls within the said limits so that the electronic automatic frequency control circuit then operates to reduce the said difference, and a hunting operation system which is operated when the search stopping circuit is actuated as aforesaid and which selects the other gear ratio of the gear box and operates the motor control circuit to cause the mechanical frequency control of the oscillation to be driven backwards and forwards at a second speed, which is less than the first speed, between limits at which the power output from the oscillator does not fall by more than a predetermined amount from its maximum value.

3. An electric oscillation generator system according to claim 2 wherein the electronic automatic frequency control system comprises a mixer to heterodyne a portion of the output from the oscillator with the said control oscillation and a frequency discriminator to which is fed the output from the mixer and which supplies the said electric signal to the control path.

References Cited in the file of this patent

UNITED STATES PATENTS

| | | |
|---|---|---|
| 2,434,294 | Ginzton | Jan. 13, 1948 |
| 2,568,412 | Robinson | Sept. 18, 1951 |